(12) United States Patent
Zhang

(10) Patent No.: US 6,441,673 B1
(45) Date of Patent: Aug. 27, 2002

(54) HIGH-FREQUENCY RESONANT GATE DRIVER CIRCUIT FOR MOS-GATED POWER SWITCHES

(75) Inventor: Richard S. Zhang, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/706,888

(22) Filed: Nov. 6, 2000

(51) Int. Cl.[7] .............................................. H03K 17/56
(52) U.S. Cl. ....................... 327/423; 327/424; 327/588; 327/110; 327/448
(58) Field of Search ................................ 327/108, 110, 327/423, 424, 309, 310, 314, 325, 432, 588, 447, 448, 376, 377; 318/599, 800, 801, 804, 811

(56) References Cited

U.S. PATENT DOCUMENTS

| | | | |
|---|---|---|---|
| 5,010,261 A | | 4/1991 | Steigerwald |
| 5,019,719 A | * | 5/1991 | King ........................... 327/110 |
| 5,095,224 A | * | 3/1992 | Renger ........................ 327/110 |
| 5,140,201 A | * | 8/1992 | Uenishi ....................... 327/108 |
| 5,204,561 A | * | 4/1993 | Rischmuller ................. 327/427 |
| 5,428,522 A | * | 6/1995 | Millner et al. ................. 363/63 |
| 5,438,290 A | * | 8/1995 | Tanaka ........................ 327/108 |
| 5,514,921 A | | 5/1996 | Steigerwald |
| 5,903,181 A | * | 5/1999 | Mori ........................... 327/108 |
| 6,147,545 A | * | 11/2000 | Marshall ..................... 327/424 |

OTHER PUBLICATIONS

"A MOSFET Resonant Synchronous Rectifier for High–Frequency DC/DC Converters," WA Tabisz; FC Lee; DY Chen, IEEE PESC, 1990, pp. 769–779.
"Design of High–Efficiency RF Class–D Power Amplifer," S–A El–Hamamsy;, IEEE Transactions on Power Electronics, vol. 9, No. 3, May 1994, pp. 297–308.
"A MOS Gate Drive with Resonant Transitions," D. Maksimović, IEEE Proceeding of PESC 1991, pp. 527–532.
"A Resonant Pulse Gate Drive for High Frequency Applications," IEEE Proceedings of APEC, 1992, pp. 738–743.

* cited by examiner

*Primary Examiner*—Terry D. Cunningham
*Assistant Examiner*—Long Nguyen
(74) *Attorney, Agent, or Firm*—Jill M Breedlove; Christian G. Cabou

(57) ABSTRACT

A resonant gate driver circuit suitable for driving MOS-gated power switches in high-frequency applications recovers gate drive energy stored in the gate capacitance of the power switches, resulting in substantially lossless operation. The resonant gate driver circuit provides bi-polar gate control signals that are compatible with PWM operation.

8 Claims, 7 Drawing Sheets

Gate capacitor charge v.s. gate voltage

Loss comparison between the resonant gate driver (top trace, loss on the internal gate resistor) and traditional gate driver (bottom trace, total loss on the internal and external gate resistors)

HIGH-FREQUENCY RESONANT GATE DRIVER CIRCUIT FOR MOS-GATED POWER SWITCHES

BACKGROUND OF THE INVENTION

The present invention relates generally to power converters and, more particularly, to a lossless gate driver circuit for MOS-gated power switching devices in high-frequency applications.

In a conventional gate driver circuit, energy stored in the gate capacitance of a switching device is dissipated in the internal and external gate resistors during turn-on and turn-off of the switching device. For example, for a 1200V/600A trench gate insulated gate bipolar transistor (IGBT) switching at 62 kHz, the power loss can be as high as 9 W and is mainly dissipated in the external gate resistor of the IGBT. High-power, low-inductance, high-cost resistors are thus needed to implement the external gate resistance, and additional heat sinking or cooling is typically required.

Accordingly, it is desirable to provide a substantially lossless gate driver circuit for power switching devices in high-frequency applications, while providing desirable turn-on and turn-off voltage levels and controllable gate voltage slew rate. It is further desirable that such gate driver circuit have the capability of recycling the gate charge and thereby achieve substantially lossless gate control.

BRIEF SUMMARY OF THE INVENTION

A resonant gate driver circuit suitable for driving power switches in high-frequency applications recovers gate drive energy stored in the gate capacitance of the power switches, resulting in substantially lossless operation. In a preferred embodiment, the resonant gate driver circuit provides bipolar gate control signals that are compatible with PWM operation.

In an exemplary resonant gate driver circuit for driving a power switching device, on-state and off-state voltage sources are coupled in series with each other, the series combination of voltage sources being coupled across a half-bridge configuration of on-state and off-state switching devices. A clamp diode is coupled across each on-state and off-state switching device, respectively. A resonant inductor is coupled between the junction joining the switching devices and the junction joining the clamp diodes. The gate of the power switching device is coupled to the resonant inductor at the junction joining the clamp diodes. The junction between the on-state and off-state voltage sources is connected to the emitter of the power switch.

In operation, energy stored in the gate capacitance is transferred to the resonant inductance during each switching event (i.e., turn on or turn off) of the power switch; and the stored energy is subsequently recovered by the on-state and off-state voltage sources in the same switching event of the power switching device.

DETAILED DESCRIPTION OF THE INVENTION

Figure 1:
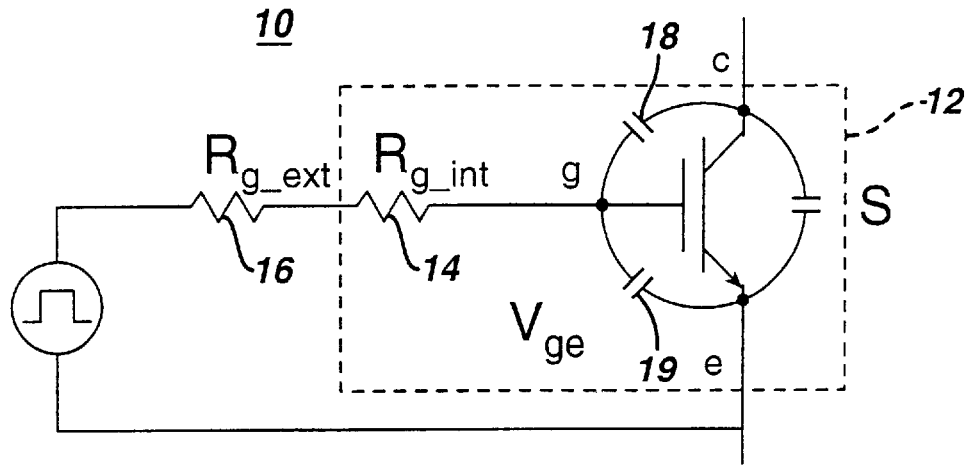
FIG. 1 schematically illustrates a conventional gate driver circuit for driving a power switch in high-frequency applications.

FIG. 1 illustrates a conventional gate driver 10 for power switches in high power pulse width modulated (PWM) converters. Although the gate driver circuit according to preferred embodiments is described herein with respect to a PWM converter, it is to be understood that the present invention is not limited to PWM operation and is applicable to other types of converters using MOS-gated power switches, such as, for example, pulse density modulated converters, resonant converters, and quasi-resonant converters.

As illustrated in FIG. 1, a high-current, MOS-gated power switch 12 (S) normally comprises multiple low-current power switch cells in parallel. The power switch comprises an internal gate resistor 14 ($R_{g\_int}$) that dampens potential gate signal parasitic ringing among the power switch cells. An external gate resistor 16 ($R_{g\_ext}$) controls the turn-on and turn-off speed of the power switch. The power switch further comprises a gate capacitance $C_{iss}$, that is, the equivalent capacitance formed by the gate-to-collector capacitance 18 and the gate-to-emitter capacitance 19.

In operation of the conventional gate driver circuit of FIG. 1, energy stored in the gate capacitance $C_{iss}$ at each turn-on or turn-off occurrence, represented as $E_{sw}=\frac{1}{2}C_{iss}(V_{on}+V_{off})^2$, is dissipated in the two gate resistors. In high-frequency PWM operation, for example, the total power loss $P_{sw}$ can be estimated as follows:

$$P_{sw}=C_{iss}(V_{on}+V_{off})^2 f_{sw},$$

where $f_{sw}$ is the switching frequency and $$C_{iss} = \frac{Q_{sw}}{V_{on} + V_{off}},$$

where $Q_{sw}$ is the charge stored in the gate capacitance.

Typically, for a 1200V/600A trench gate IGBT switching at 62 kHz, for example, the power loss can be as high as 9 W and is mainly dissipated in $R_{g\_ext}$ since normally $R_{g\_ext} \gg R_{g\_int}$. Therefore, an expensive, high-power, low-inductance resistor is needed for $R_{g-ext}$. Moreover, additional heat sinking or cooling is typically needed for $R_{g-ext}$.

Figure 2:
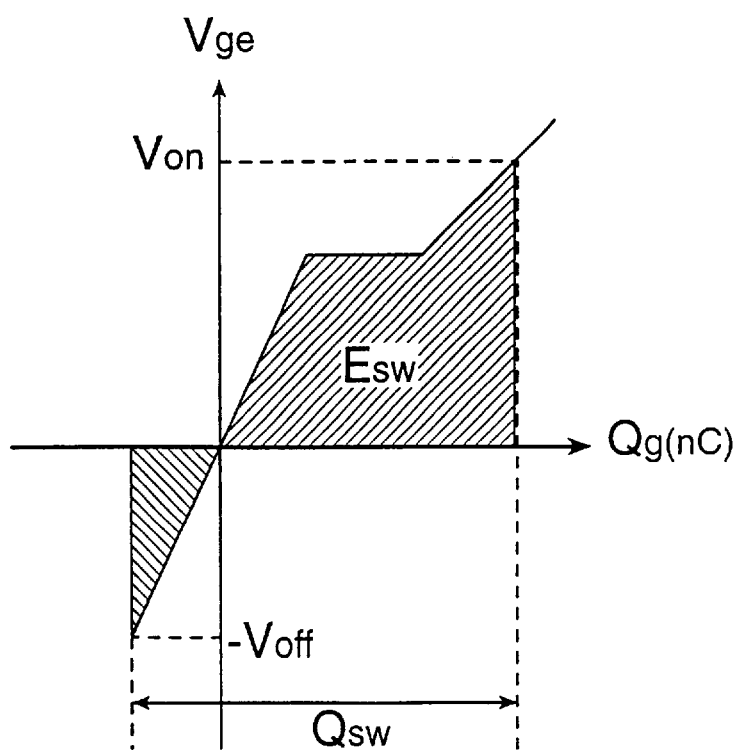
FIG. 2 graphically illustrates gate-capacitor charge versus gate voltage for the gate driver circuit of FIG. 1.

FIG. 2 illustrates a graph of gate capacitor charge Qg versus gate voltage Vge. The area under the graph of FIG. 2 represents the energy Esw that is dissipated in the power switch's internal gate resistor $R_{g-int}$ and the external gate resistor $R_{g-ext}$ in the conventional gate driver circuit of FIG. 1.

Figure 3:
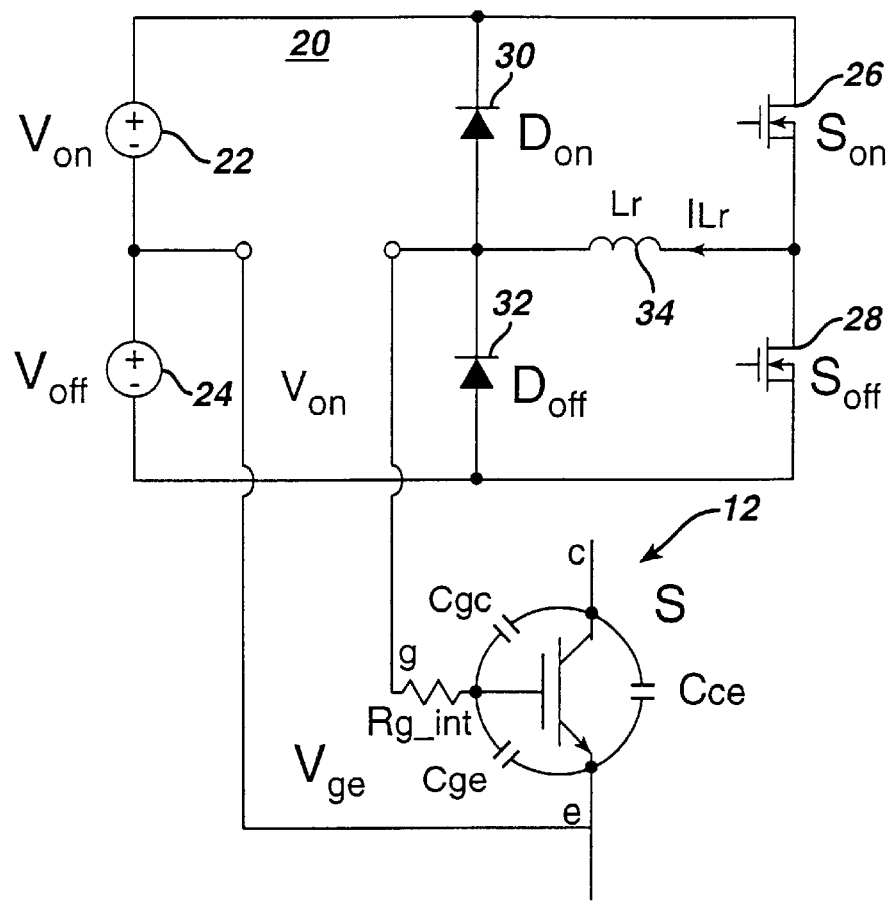
FIG. 3 schematically illustrates a resonant gate driver circuit in accordance with an exemplary embodiment of the present invention.

FIG. 3 illustrates an exemplary resonant gate driver circuit 20 in accordance with preferred embodiments of the present invention. As illustrated, gate driver circuit 20 advantageously does not require an external resistor Rext, unlike the conventional circuit 10 of FIG. 1. Gate driver circuit 20 comprises a voltage source, illustrated in FIG. 3 as comprising an on-state voltage source 22 in series with an off-state voltage source 24. A half-bridge configuration of an on-state switching device 26 (Son) in series with an off-state switching device 28 (Soff) is connected across the series connection of Von and Voff. Each switching device 26 and 28, respectively, has a clamp diode 30 (Don) and (Doff) 32, respectively, coupled thereacross. A resonant inductance 34 (Lr) is situated between the junctions joining the switching devices and the clamp diodes. The junction between the voltage sources Von and Voff is connected to the emitter of power switch 12, and the junction between the clamp diodes is connected to the gate of power switch 12.

Figure 4:
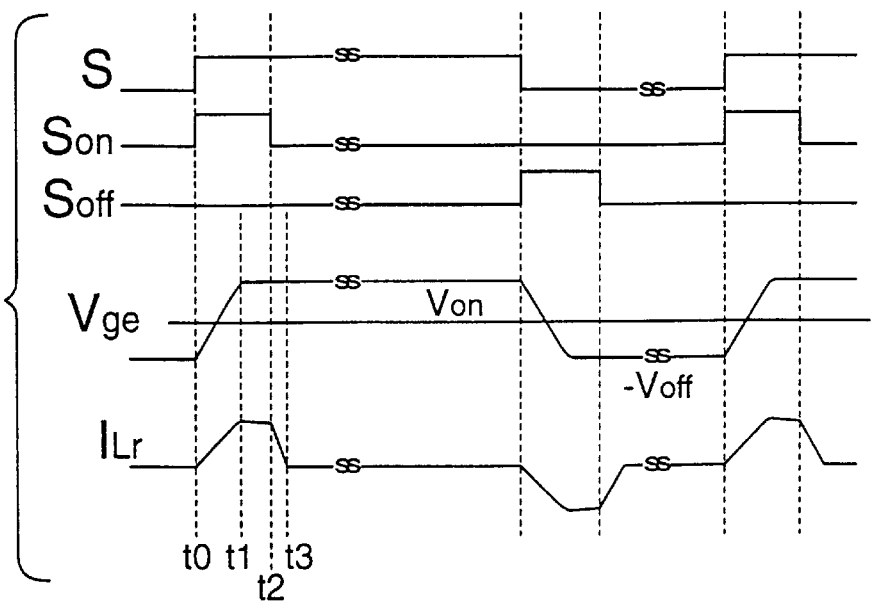
FIG. 4 graphically illustrates operation of the gate driver circuit of FIG. 3.

FIG. 4 graphically illustrates operation of the gate driver circuit of FIG. 3. In particular, FIG. 4 shows the gate control signals on switches S, Son and Soff in addition to the gate-emitter voltage Vge and the resonant inductor current. Since the circuit of FIG. 3 is symmetrical for turn-on and turn-off, the ensuing description of FIG. 4 with respect to the operation of FIG. 3 describes turn-on only in detail.

During the interval [t0–t1], assuming initially that the power switch is in an off-state, the gate voltage $V_{ge}=-V_{off}$ and the resonant inductor current is zero. At time t0, $S_{on}$ turns on and a resonant tank is formed by Von, the resonant inductor Lr, and the equivalent gate capacitance $C_{iss}$. The gate voltage $V_{ge}$ rises in a resonant fashion from the value $-V_{off}$.

During the interval [t2–t3], once $D_{on}$ conducts $S_{on}$ is turned off. The freewheeling resonant inductor current $L_{Lr}$ circulates through the integral, anti-parallel body diode (not shown) of $S_{off}$ and clamp diode $D_{on}$ to $V_{on}$ and $V_{off}$; thus, the energy stored in the resonant inductor $L_r$ is recovered back by the source. (As used herein and as understood in the art, the term anti-parallel refers to an opposite-polarity type connection, i.e., between a switching device and a diode such that the cathode of the diode is connected to the collector of the switching device.) This interval ends at time t3 when $I_{Lr}$ reduces to zero and the clamp diode across $S_{off}$ turns off naturally.

During the interval [t3–t4], the power switch is in the on-state. For high switching frequency operation, the gate voltage $V_{ge}$ can hold at the voltage level $V_{on}$ and keep the power switch in the on-state.

Figure 5:
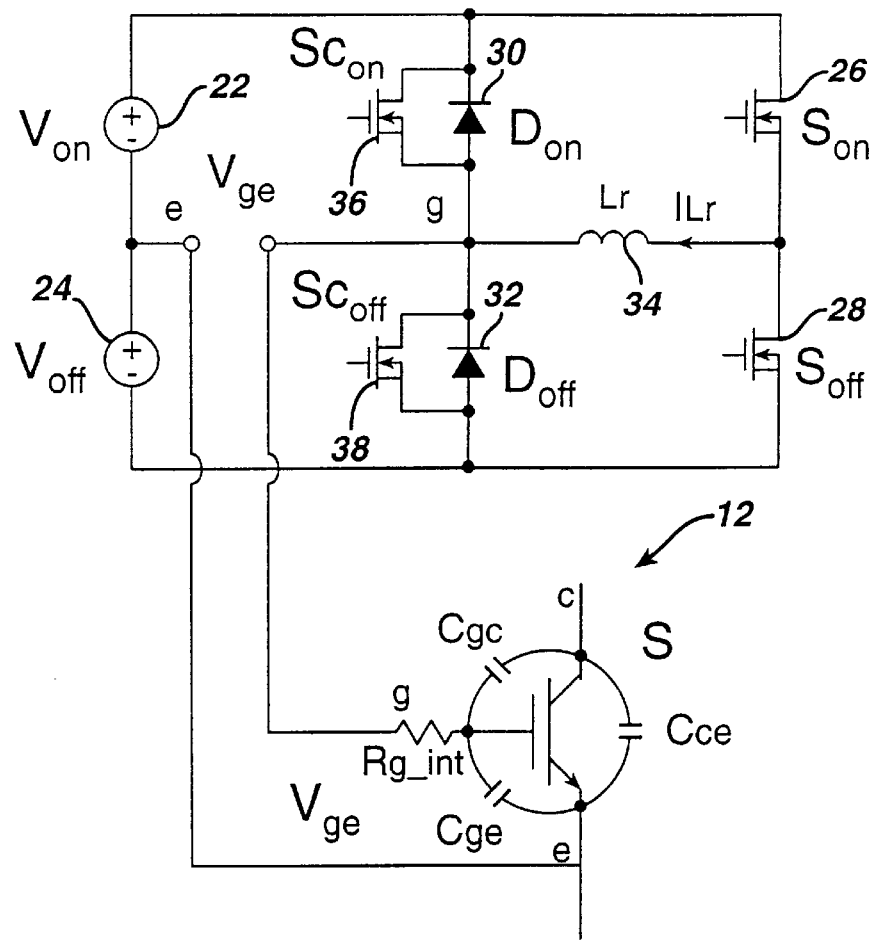
FIG. 5 schematically illustrates an alternative exemplary embodiment of a resonant gate driver circuit in accordance with the present invention.
Figure 6:
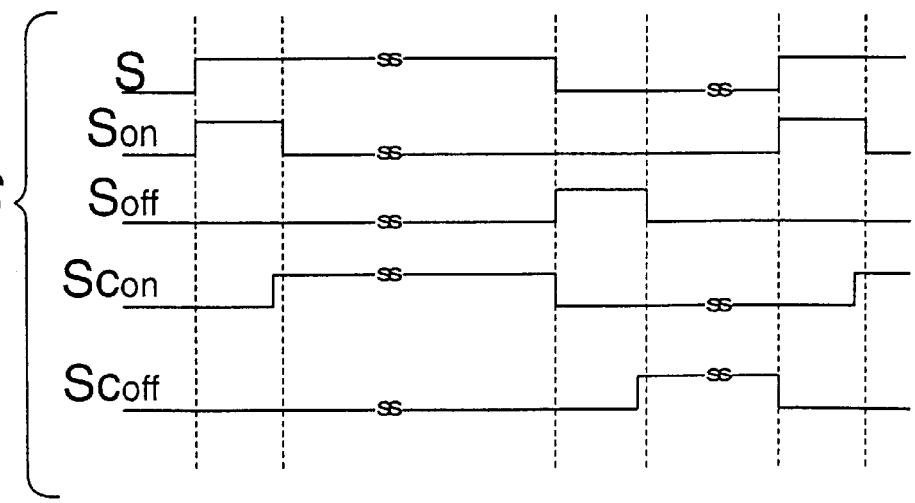
FIG. 6 graphically illustrates timing of switching devices in the circuit of FIG. 5.

FIG. 5 illustrates an alternative exemplary embodiment of the gate driver circuit of FIG. 3 for increasing the circuit's noise immunity and to ensure the desired voltage levels at turn-on and turn-off. In particular, additional small clamp switches 36 and 38, respectively, are coupled across the clamp diodes Don and Doff, respectively. $Sc_{on}$ clamps $V_{ge}$ at $V_{on}$ at turn-on, while $Sc_{off}$ clamps $V_{ge}$ at $-V_{off}$ at turn-off. Timing diagrams for the two clamp switches are shown in FIG. 6.

Figure 7:
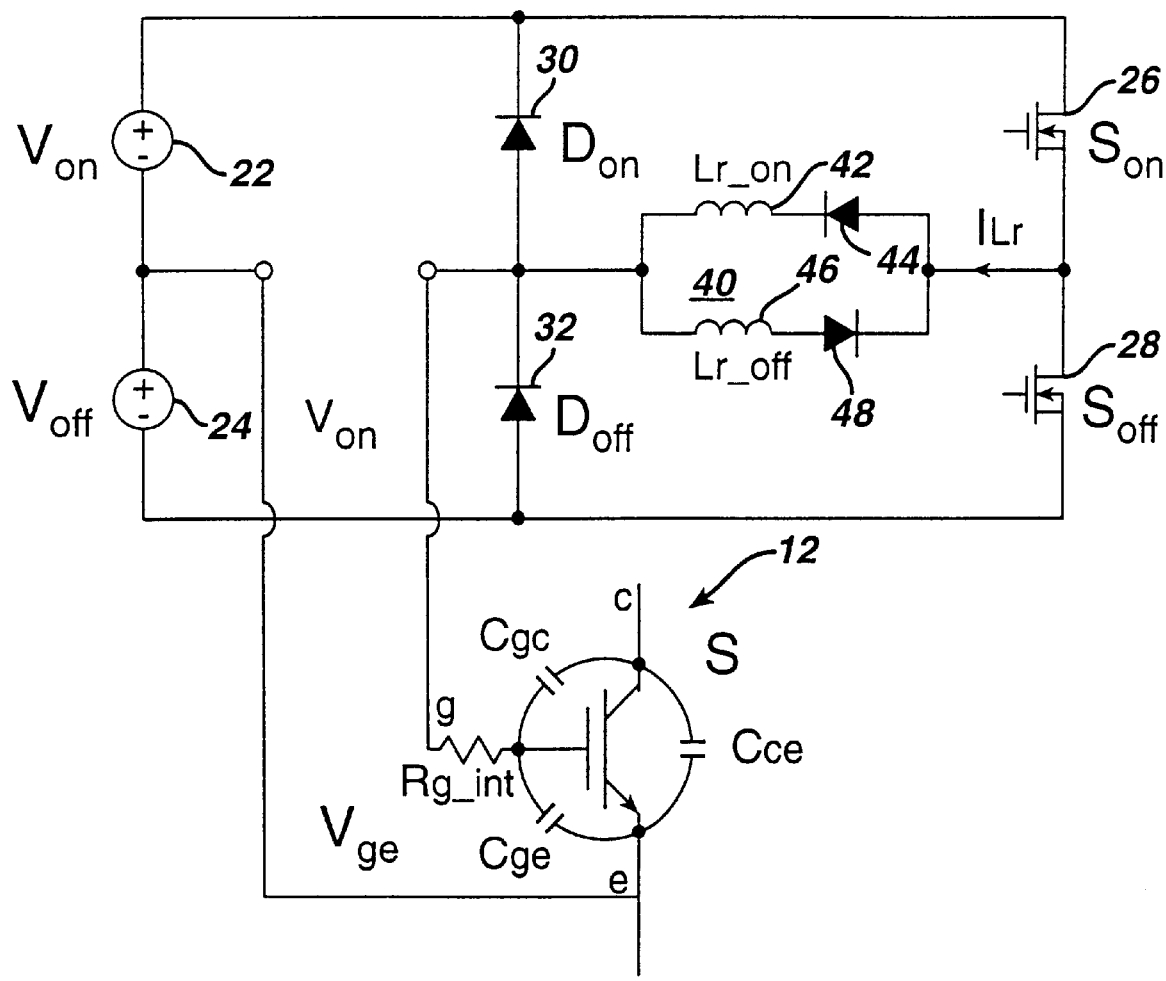
FIG. 7 schematically illustrates another alternative exemplary embodiment of a resonant gate driver circuit in accordance with the present invention.

FIG. 7 illustrates an alternative exemplary embodiment of the gate driver circuit of FIG. 3 for independently adjusting turn-on and turn-off times of power switch 12. In particular, FIG. 7 shows the replacement of the resonant inductor 34 of FIG. 3 with an inductor-diode circuit 40 comprising a series combination of an on-state inductor 42 and a diode 44 and a series combination of an off-state inductor 46 and a diode 48. When switch Son is conducting, the resonant inductor current flows through inductor 42 and diode 44. When switch Soff is conducting, the resonant inductor current flows through inductor 46 and diode 48. The additional inductor and diodes result in different resonant frequencies at turn-on and turn-off and, hence, different turn-on and turn-off times.

Once the power switch gate capacitance Ciss is known, the resonant inductance Lr can be designed. Selection of the resonant inductor is preferably based on two criteria: (1) satisfying the desired power switch turn-on and turn-off times; and (2) minimizing the power loss on the internal gate resistor. The rising (or falling) time of the gate voltage and the power loss on the $R_{g-int}$ can be calculated.

Figure 8:
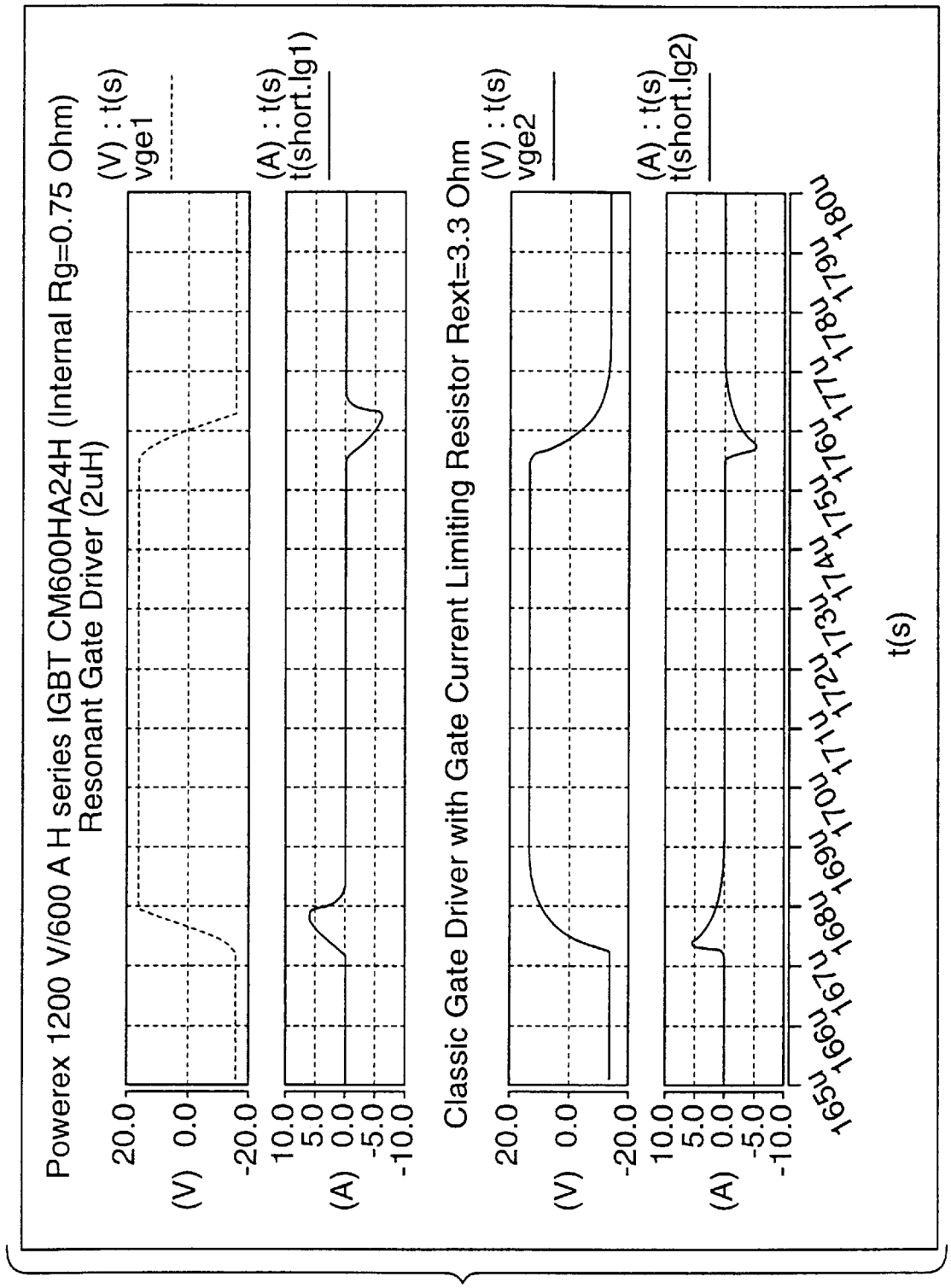
FIG. 8 graphically illustrates exemplary gate voltage and gate current waveforms for a resonant gate driver in accordance with exemplary embodiments of the present invention and for a conventional (classic) gate driver circuit such as that of FIG. 1.

For comparison and by way of example, FIG. 8 illustrates exemplary simulation waveforms of the gate driver of FIG. 1 and the resonant gate driver of FIG. 3. Both the gate voltage and the gate current have different waveform shapes.

Figure 9:
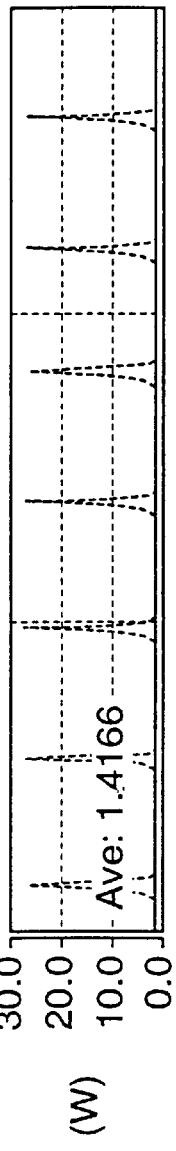
FIG. 9 graphically illustrates power switch internal gate resistor losses for a resonant gate driver in accordance with exemplary embodiments of the present invention and for a conventional (classic) gate driver circuit such as that of FIG. 1.
Figure 9:
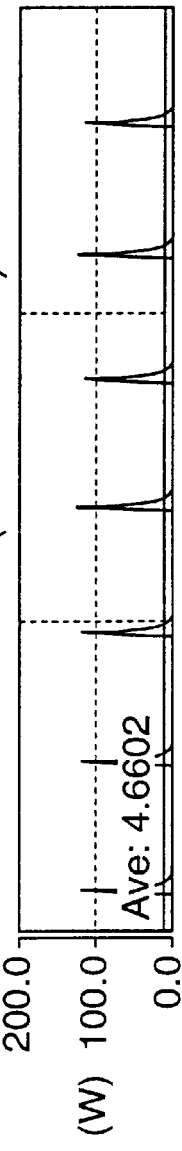

FIG. 9 graphically illustrates gate resistor losses for the conventional gate driver of FIG. 1 and the resonant gate driver of FIG. 3, each employing a Powerex 1200V/600A H Series IGBT power switch. As shown, the resonant gate driver circuit of FIG. 3 advantageously results in only 30% of the losses of those of the conventional gate driver.

Figure 10:
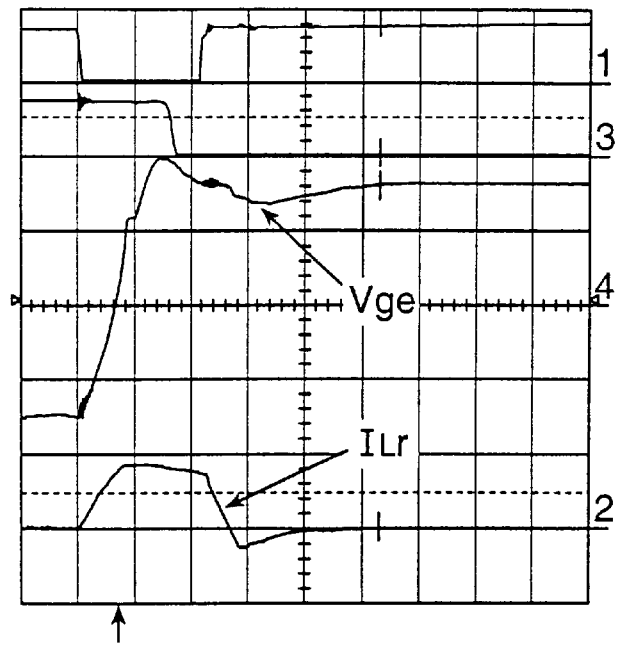
FIGS. 10 and 11 graphically illustrate exemplary experimental results showing gate voltage Vge and resonant inductor current waveforms at turn-on (FIG. 10) and turn-off (FIG. 11) for a resonant gate driver circuit in accordance with preferred embodiments of the present invention.
Figure 11:
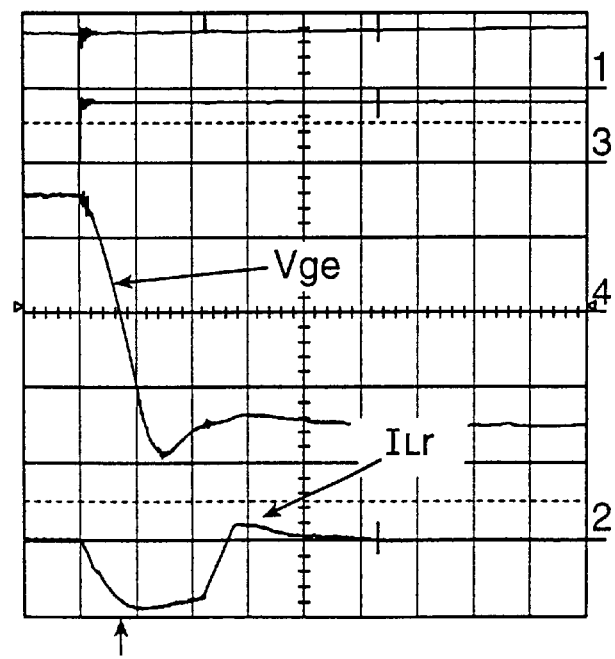

FIGS. 10 and 11 graphically illustrate exemplary experimental results illustrating gate voltage Vge and resonant inductor current waveforms at turn-on (FIG. 10) and turn-off (FIG. 11) for a resonant gate driver circuit in accordance with preferred embodiments of the present invention. Advantageously, as shown, such a resonant gate provides bi-polar gate control signals Vge, i.e., positive voltage for turn-on and negative voltage for turn-off.

In accordance with the description hereinabove, resonant gate driver circuit in accordance with preferred embodiments of the present invention recovers gate drive energy stored in the gate capacitance of power switching devices, and this energy is recovered back by the source. This is particularly advantageous for power switching devices having high gate capacitance, such as, for example, power gate-trench IGBT's and power MOSFET's.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A resonant gate driver circuit for providing drive signals to a power switching device having a gate capacitance, the gate driver circuit comprising:

an on-state gate switching device coupled in series with an off-state gate switching device in a half-bridge configuration, the on-state and off-state gate switching devices each having a clamp diode coupled in anti-parallel therewith, the half-bridge configuration adapted for coupling to a voltage source;

a resonant inductor coupled between a junction joining the on-state and off-state gate switching devices and a junction joining the clamp diodes;

the gate of the power switching device being coupled to the resonant inductor and the on-state and off-state switching devices such that energy stored in the gate capacitance is transferred to the resonant inductor during each switching event of the power switching device, and the stored energy is subsequently recovered by the voltage source in the same switching event of the power switching device.

2. The gate driver circuit of claim 1, further comprising clamping switches coupled across each gate switching device.

3. The gate driver circuit of claim 1 wherein the resonant inductor comprises an on-state inductor coupled in series with an on-state diode, the series connection of the on-state inductor and on-state diode being coupled in parallel with an off-state inductor and an off-state diode.

4. The gate driver circuit of claim 1 wherein the drive signals comprise bi-polar gate drive signals.

5. A resonant gate driver circuit for providing drive signals to a power switching device having a gate capacitance, the resonant gate driver circuit comprising:

an on-state gate switching device coupled in series with an off-state gate switching device in a half-bridge configuration, the on-state and off-state gate switching devices each having a clamp diode coupled in anti-parallel therewith, the half-bridge configuration adapted for coupling across a series connection of an on-state voltage source and an off-state voltage source;

a resonant inductor coupled between a junction joining the on-state and off-state gate switching devices and a junction joining the clamp diodes;

the gate of the power switching device being coupled to the junction joining the clamp diodes, and the emitter of the power switching device being coupled to the junction joining the voltage sources;

such that energy stored in the gate capacitance is transferred to the resonant inductor during each switching event of the power switching device, and the stored energy is subsequently recovered by on-state and off-state voltage sources in the same switching event of the power switching device.

6. The gate driver circuit of claim 5, further comprising clamping switches coupled across each gate switching device.

7. The gate driver circuit of claim 5, wherein the resonant inductor comprises an on-state inductor coupled in series with an on-state diode, the series connection of the on-state inductor and on-state diode being coupled in parallel with an off-state inductor and an off-state diode.

8. The gate driver circuit of claim 5, wherein the drive signals comprise bi-polar gate drive signals.

* * * * *